(12) United States Patent
Yokoyama

(10) Patent No.: US 7,352,650 B2
(45) Date of Patent: Apr. 1, 2008

(54) EXTERNAL CLOCK SYNCHRONIZATION SEMICONDUCTOR MEMORY DEVICE AND METHOD FOR CONTROLLING SAME

(75) Inventor: Yoshisato Yokoyama, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 104 days.

(21) Appl. No.: 11/413,008

(22) Filed: Apr. 28, 2006

(65) Prior Publication Data

US 2006/0268656 A1 Nov. 30, 2006

(30) Foreign Application Priority Data

May 27, 2005 (JP) ............... 2005-155395

(51) Int. Cl.
*G11C 8/00* (2006.01)
(52) U.S. Cl. .................. 365/233; 365/203; 365/63
(58) Field of Classification Search ........... 365/233, 365/203, 63
See application file for complete search history.

(56) References Cited

U.S. PATENT DOCUMENTS 6,404,700 B1 * 6/2002 Agrawal ............. 365/233
6,928,013 B2 * 8/2005 Chang ............... 365/203

FOREIGN PATENT DOCUMENTS

| JP | 8-297978 | 11/1996 |
|---|---|---|
| JP | 10-188564 | 7/1998 |
| KR | 1998-063471 | 10/1998 |
| KR | 10-0227294 | 8/1999 |
| KR | 10-2004-0006107 | 1/2004 |

OTHER PUBLICATIONS

K. Takeda, et al.,"A read-Static-Noise-Margin-Free SRAM Cell for Low-Vdd and High-Speed Applications", Proc. 2005 IEEE Int. Solid-State Circuit Conf. pp. 478-479,611.
Korean Office Aciton dated Jul. 31, 2007 with partial English translation.

* cited by examiner

*Primary Examiner*—Huan Hoang
(74) *Attorney, Agent, or Firm*—McGinn IP Law Group, PLLC

(57) ABSTRACT

An external clock synchronization SRAM 1 of one embodiment comprises a SRAM cell, a global digit line, a global precharge circuit, a D latch, and a global precharge control circuit. A delay circuit is disposed in the global precharge control circuit so that the precharge output of the global precharge circuit changes with a delay with respect to the clock signal supplied to the D latch.

19 Claims, 9 Drawing Sheets

EXTERNAL CLOCK SYNCHRONIZATION SEMICONDUCTOR MEMORY DEVICE AND METHOD FOR CONTROLLING SAME

BACKGROUND OF THE INVENTION

1. Field of the Invention

The present invention relates to an external clock synchronization semiconductor memory device, and more particularly to maintaining a signal output from a memory cell in an external clock synchronization semiconductor memory device.

2. Description of Related Art

A SRAM has been widely used as a volatile memory for storing data in semiconductor integrated circuits for various applications. A dual end configuration comprising two digit lines and a single end configuration in which a cell output is transmitted via a single digit line are known as SRAM configurations (for example, K. Takeda et al., "A read-Static-Noise-Margin-Free SRAM Cell for Low-Vdd and High-Speed Applications" Proc. 2005 IEEE Int. Solid-State Circuit Conf. pp. 478-479, 611). FIG. 6 is a block diagram illustrating schematically an internal clock synchronization SRAM 6 of a single end configuration. This is an example of the SRAM representing the background of the present invention. The internal clock synchronization SRAM 6 comprises a plurality of SRAM cells (in FIG. 6, three cells 61*a*-61*c* are shown by way of an example) and word lines 62*a*-62*c* for selecting one of the SRAM cells 61*a*-61*c*. Furthermore, the internal clock synchronization SRAM 6 comprises a digit line 63 for transmitting data signals that have been stored in the SRAM cells 61*a*-61*c*. An inverter serving as a sense amplifier 64 is connected to the output side of the digit line 63. Furthermore, a D latch 65 for fetching, outputting and maintaining the signals from the sense amplifier 64 is connected to the output of the sense amplifier 64.

A precharge circuit 66 is further connected to the digit line 63. The precharge circuit 66 is controlled by the output signal PC of a logical circuit 67. A delay circuit 68 is connected to one input of the OR logical circuit 67. Each internal circuit of the internal clock synchronization SRAM 6 is controlled by an internal clock signal ICL generated by an internal clock generation circuit 69 from a clock signal CLK. Here, a word signal on the word lines 62*a*-62*c*, a signal on the digit line 63, a sense amplifier output signal, a D latch output signal, and a D latch input signal are represented by WL, DT, DLDT, DO, and LACLK, respectively.

FIG. 7 is a timing chart illustrating the operation of the internal clock synchronization SRAM 6. In the example shown herein, data "0" (LOW signal) is outputted from a specific SRAM cell. In FIG. 7, each arrow symbol shows the relationship between one signal change and another signal change caused thereby. The same is true for all the timing charts explained hereinbelow. The internal clock generation circuit 69 generates an internal clock signal ICL with a pulse width less than that of an external clock signal CLK from which the internal clock signal is generated. The signals such as WL, PC, and LACLK are synchronized with the ICL. Because of the presence of the delay circuit 68, the PC falls with a delay with respect to the fall of the ICL. Here, the design is such that the HIGH width of the ICL is larger than the fall width of the DT.

The internal clock synchronization SRAM 6 is operated by an internal clock signal with a pulse width less than that of the external clock CLK. Therefore, the internal clock synchronization SRAM 6 is suitable for high-speed operation and is easily synchronization controlled. However, the problem associated therewith is that a circuit is required for generating the internal clock signal. Another problem is that the operation instability is increased in the course of high-speed operation.

By contrast, an external clock synchronization SRAM operating synchronously with an external clock signal is known. The external clock synchronization SRAM is inferior to the internal clock synchronization SRAM in terms of operation speed. However, it is generally superior to the internal clock synchronization SRAM in terms of circuit scale and operation stability. FIG. 8 is a block diagram illustrating schematically an external clock synchronization SRAM of a signal end configuration representing the background of the present invention. In FIG. 8, a external clock synchronization SRAM 8 comprises a plurality of banks. In FIG. 8, two banks 81*a*, 81*b* among them are shown by way of an example. Each bank 81*a*, 81*b* comprises a plurality of SRAM cells 811*a*-811*d* and a plurality of word lines 812*a*-812*d* connected to respective SRAM cells 811*a*-811*d*. Furthermore, each bank 81*a*, 81*b* comprises local digit lines 813*a*, 813*b* connected to each SRAM cell. A signal on the word lines 812*a*-812*d* is shown as WL and a signal on the local digit lines 813*a*, 813*b* is shown as DTL.

Inverters 814*a*, 814*b* are connected as sense amplifiers to respective output sides of the local digit lines 813*a*, 813*b*. The output of each inverter 814*a*, 814*b* is connected to the NMOS 815*a*, 815*b*. A global digit line 82 is connected to the NMOS outputs 815*a*, 815*b* of each bank. A signal on the global digit line 82 is shown as DTG. Furthermore, local precharge circuits 816*a*, 816*b* are connected to the output sides of the local digit lines 813*a*, 813*b*. The local precharge circuits 816*a*, 816*b* are controlled by control signals PCL.

An inverter serving as a global sense amplifier 83 is connected to the output side of the global digit line 82. The output of the global sense amplifier 83 is outputted as an output data signal DO to the outside via the inverter 85. A global precharge circuit 84 is connected to the output side of the global digit line 82. A PCG signal for controlling the precharge timing is inputted into the global precharge circuit 84. The global precharge circuit 84 turns to the ON state in response to the PCG signal and precharges the global digit line 82 to a global precharge potential (HIGH).

FIG. 9 is a timing chart illustrating the operation of the external clock synchronization SRAM 8. In the example shown herein, data "0" (LOW signal) is outputted from the selected SRAM cell. The PCL, WL, and PCG vary in response to the variation of the external clock signal CLK. If the DTL is caused to fall by the output from the selected SRAM cell, the DTG falls in response thereto. If the DTG falls, the output signal DO, which is at a precharge potential, changes from HIGH to LOW. If then the external clock signal CLK changes from HIGH to LOW, the PCL and PCG become LOW and the DTL and DTG are precharged to HIGH. Similarly, the output signal DO also changes to the precharge potential HIGH.

In FIG. 9, the holding time of the output signal is denoted by tOH. As follows from the explanation provided hereinabove, in the configuration of the external clock synchronization SRAM 8, the global precharge circuit 84 is switched ON/OFF at almost the same timing with the external clock signal CLK. For this reason, if the external clock signal CLK falls, the global precharge circuit 84 turns to the ON state and precharges the global digit line 12 to HIGH. Furthermore, the change in the output of the global precharge circuit 84 is represented by the change in the output signal DO. For this reason, despite the fact that a certain time essentially remains before the next data signal output is produced, the global precharge circuit 84 becomes ON in response to the fall of the external clock signal CLK. As a result, the output signal DO changes from LOW to HIGH at an early timing.

SUMMARY OF THE INVENTION

According one aspect of the present invention, an external clock synchronization semiconductor memory device in which each internal circuit operates according to a clock signal input from outside, comprising a memory cell; a memory cell signal transmission line transmitting an output signal from the memory cell; a precharge circuit precharging the memory cell signal transmission line; a signal holding circuit fetching a signal transmitted by the memory cell signal transmission line according to the fetch control signal and outputting the fetched signal; and a precharge control circuit conducting control so that the precharge output of the precharge circuit changes with a delay with respect to the fetch control signal is disclosed.

According to another aspect of the present invention, a control method for an external clock synchronization semiconductor memory device in which each internal circuit operates according to a clock signal input from outside, the control method comprising selecting a memory cell for outputting a signal; fetching the selected memory cell output transmitted on a transmission line to a signal holding circuit and outputting the fetched signal as an output signal to the outside; and precharging the transmission line after the fetching of a signal by the signal holding circuit is prohibited is disclosed.

In the external clock synchronization semiconductor memory device, an output signal can be maintained for a longer period, without the output signal from a memory cell being changed by precharging, by conducting the precharging of the transmission line at a timing after the output signal from a memory cell has been fetched by a signal holding circuit, when the signals are not fetched by the signal holding circuit.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Embodiment 1

Figure 1:
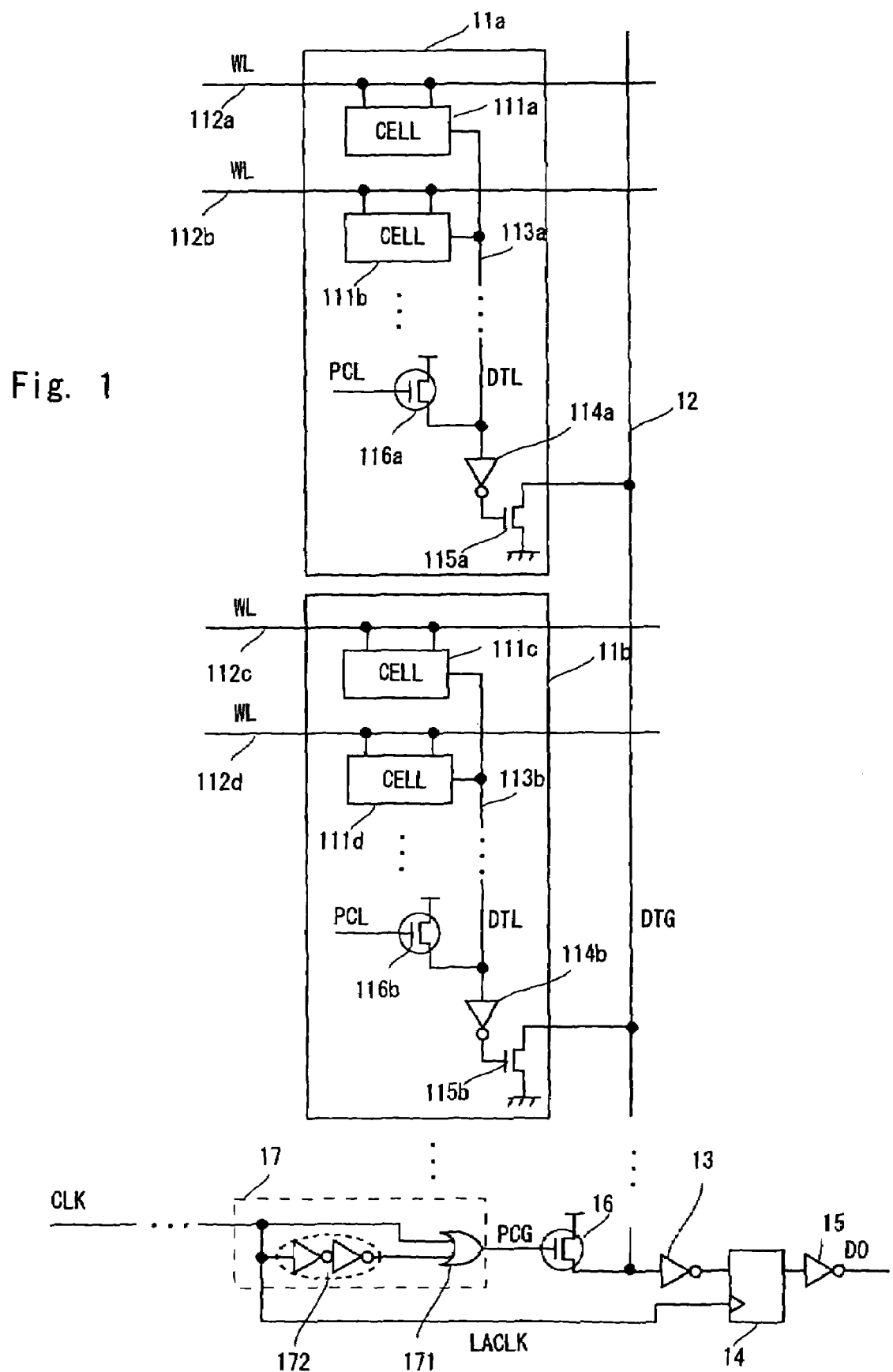
FIG. 1 illustrates schematically the configuration of an external clock synchronization SRAM of a single end configuration in Embodiment 1.

FIG. 1 is a circuit diagram illustrating schematically a partial configuration of the external clock synchronization SRAM 1 of the present embodiment. This is shown as an example of a external clock synchronization semiconductor memory device. In the external clock synchronization SRAM 1, the operation of each internal circuit is controlled according to the external clock signal CLK inputted from the outside. All the clock signals controlling the operation of each internal circuit may have phase difference with respect to the inputted external clock signal, but the periods and pulse widths thereof are the same. In the external clock synchronization SRAM 1, the circuit scale can be reduced because an internal clock generation circuit for generating a new internal clock signal from the external clock signal is not required. Furthermore, the external clock synchronization SRAM generally has an operation speed lower (access time is added) than the internal clock synchronization SRAM, but demonstrates an excellent characteristic in terms of operation stability.

Referring to FIG. 1, the external clock synchronization SRAM 1 comprises a plurality of banks; two banks 11a, 11b among them are shown by way of an example. The banks 11a, 11b comprise a plurality of SRAM cells 111a-111d and a plurality of word lines 112a-112d connected to the SRAM cells 111a-111d, respectively. Furthermore, the banks 11a, 11b comprise local digit lines 113a, 113b connected to the SRAM cells. The SRAM cells 111a-111d have a single end configuration with one digit line. A signal on the word lines 112a-112d is represented by WL and a signal on the local digital lines 113a, 113b is represented by DTL.

Inverters 114a, 114b serving as sense amplifiers are connected to the output sides of the local digit lines 113a, 113b, respectively. The outputs of the inverters 114a, 114b are connected to the gates of NMOS 115a, 115b. The sources of the NMOS 115a, 115b are connected to the ground, and the drains are connected to the global digit line 12. In other words, the global digit line 12 is connected to the NMOS outputs 115a, 115b of each bank. A signal on the global digit line 12 is represented by DTG.

Local precharge circuits 116a, 116b are connected to the local digit lines 113a, 113b, respectively. The local precharge circuits 116a, 116b comprise PMOS. A local precharge potential (High power source potential: Vdd) is applied to the source of the PMOS, and the drain thereof is connected to the local digit lines 113a, 113b. A PCL signal for controlling the timing of the local precharge is inputted into the gate. The local precharge circuits 116a, 116b turn to the ON state in response to a PCL signal and precharge the local digit lines 113a, 113b to a local precharge potential. Although not shown in FIG. 1, a write circuit comprising a write amplifier is formed to write the data into the SRAM cells in each bank 11a, 11b.

As described hereinabove, the external clock synchronization SRAM 1 of the present invention has a single end output structure in which the data output from the SRAM cells is transmitted via a single transmission line. The advantage of the signal end configuration over the usual dual end configuration in which the cell output signals are transmitted by a differential voltage of two output lines is that the circuit scale can be decreased. This is because the signal end configuration has one transmission line less than the dual end configuration and because the sense amplifier basically comprises one inverter.

A global sense amplifier 13 is connected to the output side of the global digit line 12 having the outputs of each bank 11a, 11b connected thereto. The global sense amplifiers 13 comprises a single inverter. Furthermore, the external clock synchronization SRAM 1 of the present embodiment comprises a D latch 14, which is an example of a signal holding circuit for temporarily holding output signals from the SRAM cells.

The output of the global sense amplifier 13 is connected to the data signal input of the D latch 14. A clock signal LACLK is inputted into the clock signal input of the D latch 14. The output of the D latch 14 is outputted to the outside as an output data signal DO via the inverter 15. The D latch 14 fetches the input data signal at a timing in which the control clock LACLK is HIGH and maintains the data signal as an output data signal.

The global precharge circuit 16 comprises a PMOS. A global precharge potential (High power source potential: Vdd) is applied to the source of this PMOS, and the drain thereof is connected to the global digit line 12. A PCG signal for controlling the timing of the global precharge is inputted into the gate. The global precharge circuit 16 turns to the ON state in response to the PCG signal and precharges the global digit line 12 to a global precharge potential.

The external clock synchronization SRAM 1 comprises a global precharge control circuit 17 for controlling the operation of the global precharge circuit 16 with a PCG signal. The global precharge control circuit 17 comprises an OR logical circuit 171 and a delay circuit 172. The output of the OR logical circuit 171 is connected to the gate of the global precharge circuit 16, and the PCG signal is supplied to the global precharge circuit 16. A delay circuit 172 is connected to one of the two inputs of the OR logical circuit 171. The delay circuit 172 can comprise a plurality of inverters connected in serial (two inverters in the present example). The external clock signal CLK is inputted into one input of the OR logical circuit 171 via the internal wiring. The external clock signal CLK is inputted into the other input of the OR logical circuit 171 via the delay circuit 172. Therefore, a difference in the delay time created by the delay circuit 172 is generated between the two input signals of the OR logical circuit 171.

Figure 2:
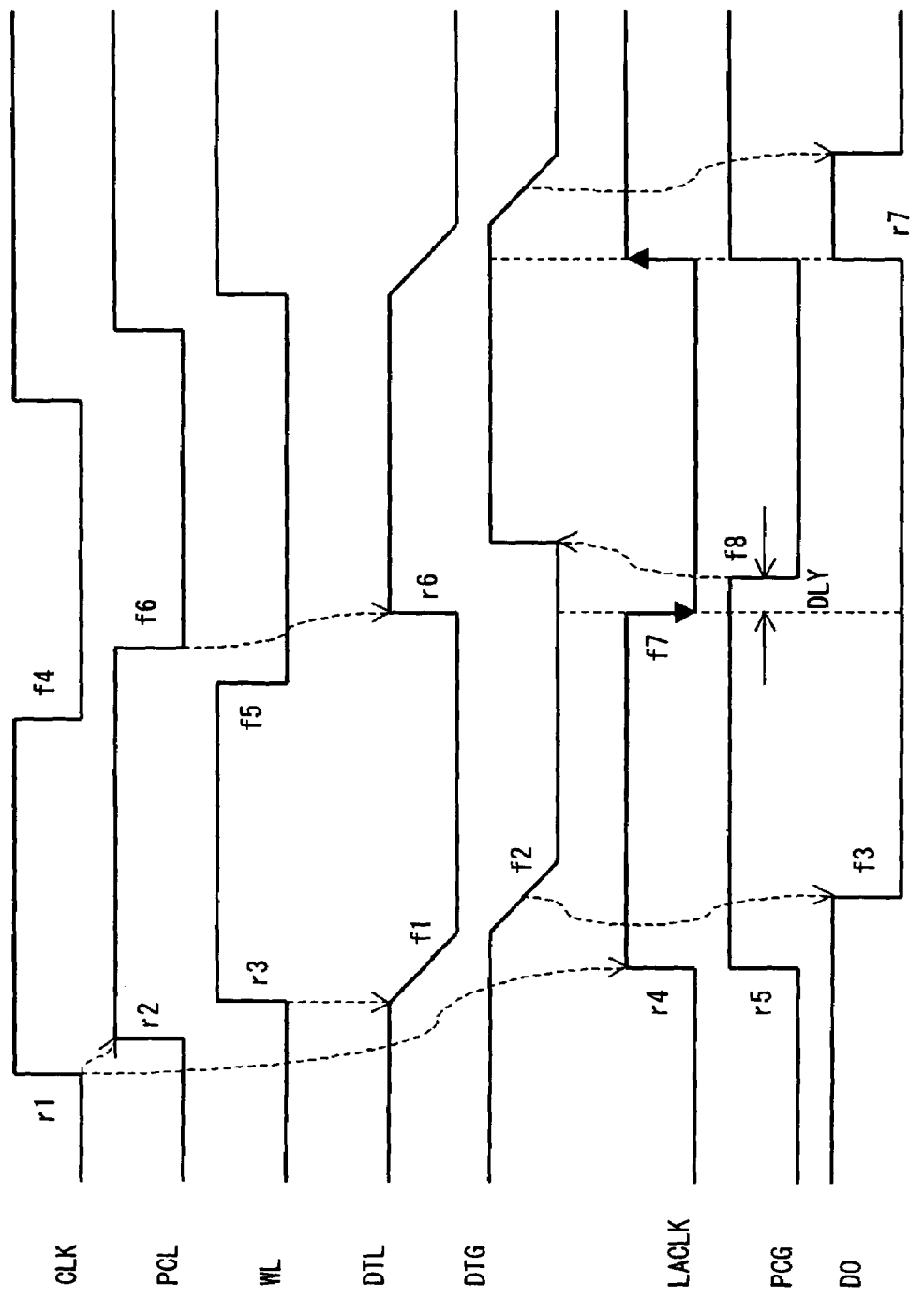
FIG. 2 is a timing chart illustrating the operation of the external clock synchronization SRAM shown in FIG. 1 of Embodiment 1.

The operation of the external clock signal SRAM 1 will be described below with reference to the timing chart shown in FIG. 2. The operation of selecting a specific SRAM cell in the bank and outputting the LOW data held in the cell will be explained.

Before the data output from a SRAM cell, the local precharge control signal PCL becomes LOW. The local precharge circuits 116a, 116b, which are in the ON state, precharge the level DTL of the local digit lines 113a, 113b to HIGH. Likewise, the global precharge control signal PCG becomes LOW. Then, the global precharge circuit 16, which is in the ON state, precharges the global digit line 12 and the DTG to HIGH.

In response to a rise edge (r1) of the external clock signal CLK, the local precharge control signal PCL changes from LOW to HIGH (r2). Because of the delay caused by the internal wiring, the change in the local precharge control signal PCL is delayed with respect to the change of the external clock signal CLK. Because of the change in the local precharge control signal PCL, the local precharge circuits 116a, 116b turn to the OFF state and stop the precharge operation. Then, the specific word line (in the present example the word line 112a) changes from a LOW selected potential to a HIGH selected potential (r3) and a specific SRAM cell (in the present example, the cell 111a) turns to a selected state. In the present case, LOW data are stored in the selected SRAM cell 111a. Therefore, the level DTL of the local digit line 113a changes from HIGH to LOW (f1).

Following the change of the signal DTL of the local digit line 113a, the output of the local sense amplifier 114a is reversed. As a result, the NMOS 115a is switched ON, and the local digit line 113a and global digit line 12 turn to a connected state.

On the other hand, in response to the rise edge of the external clock signal CLK, the global precharge control signal PCG and the D latch clock signal LACLK rise from LOW to HIGH (r4). Those signal changes are also delayed with respect to the external clock signal CLK due to the delay caused by the internal wiring. Because the global precharge control signal PCG changes from LOW to HIGH (r5), the global precharge circuit turns to the OFF state and stops the precharge operation.

Because the global precharge circuit 16 is in the OFF state, if the local digit line signal DTL changes from HIGH to LOW (f1), as described hereinabove, the charge of the global digit line 12 is pulled out to the LOW local digit line DTL. As a result, the global digit line signal DTG changes from HIGH to LOW (r2).

While the D latch clock signal LACLK is in a HIGH state, the D latch 14 fetches an input data signal inputted into the data signal input terminal. At the timing the global digit line signal DTG changes from HIGH to LOW, the D latch clock signal LACLK is HIGH. Therefore, the D latch fetches and holds the data signal present on the global digit line 12. The output of the D latch 14 changes from HIGH to the fetched LOW. The output of the D latch 14 is outputted as read data to the outside via the inverter 15. The output signal DO, which is outputted to the outside, changes from HIGH to LOW (f3).

The external clock signal CLK then falls from HIGH to LOW (f4). The word line signal WL changes from HIGH to LOW (f5) with a slight delay, and then the local precharge control signal PCL changes from HIGH to LOW (f6). In response to the changes of the local precharge control signal PCL, the local precharge circuit 116a turns to the ON state, the local digit line 113a is precharged, and the signal DTL thereof changes to HIGH (r6). The output of the local sense amplifier 114a is inverted, thereby switching OFF a NMOS transistor 115a. The local digit line 113a and global digit line 12 are then disconnected.

With a slight delay with respect to the change of the external clock signal CLK from HIGH to LOW, the D latch clock signal LACLK changes from HIGH to LOW (f7). The global precharge control signal PCG changes from HIGH to LOW with a delay with respect to the D latch clock signal LACLK (f8).

As was described with reference to FIG. 1, the global precharge control circuit 17 comprises the delay circuit 172 for delaying the output to the OR logical circuit 171. For this reason, in distinction to the rise change thereof, the global precharge control signal PCG drops to LOW with a delay by the delay quantity DLY with respect to the D latch clock signal LACLK. If the global precharge control signal PCG changes to LOW, the global precharge circuit 16 is switched ON and the global digit line 12 is precharged to HIGH.

The output signal DO does not change even if the global digit line signal DTG changes. At the timing the global digit line signal DTG changes, the D latch clock signal LACLK is LOW. Therefore, the D latch 14 does not fetch the data signals present on the global digit line 12 and the output data signal DO thereof is not changed. In other words, the change of the global digit line signal DTG is delayed with respect to the change of the D latch clock signal LACLK by the delay circuit 172 of the global precharge control circuit 17. As a result, the D latch 14 maintains a HIGH output, without fetching the LOW output present on the global digit line 12 after the change.

If the external clock then changes from LOW to HIGH, the global precharge control signal PCG and D latch control signal LACLK change from LOW to HIGH with a slight delay. No delay caused by the delay circuits occurs between them. In response to the rise of the D latch clock signal LACLK, the D latch 14 fetches the HIGH present on the global digit line 12. Therefore, the output data DO changes from LOW to HIGH (r7). After the output data DO changes to LOW, the period tOH till the output data thereafter changes from LOW to HIGH becomes an output signal holding period of SRAM 1. Thus, according to the above-described example, the output period of the output data DO can be maintained for a long time in the external clock synchronization control by holding the output signal with the D latch 14, which is a data holding circuit, and then delaying the change of the precharge output with respect to the change of the input clock signal.

Thus, the SRAM of the single end configuration excels in reducing the circuit scale. The circuit scale can be also reduced by decreasing the size of elements, but the decrease in the size of elements is accompanied by the drop in a drive voltage and the destruction of cell data becomes a problem. As described hereinabove, the external clock synchronization SRAM excels in operation stability and is especially effective in a SRAM with a low-voltage drive. The operation stability of SRAM can be further increased by using the external clock synchronization SRAM in combination with the SRAM cells of a single end configuration that can inhibit cell data destruction. The output control of the external clock synchronization SRAM of the present embodiment becomes an especially effective method in such circuit.

Figure 3:
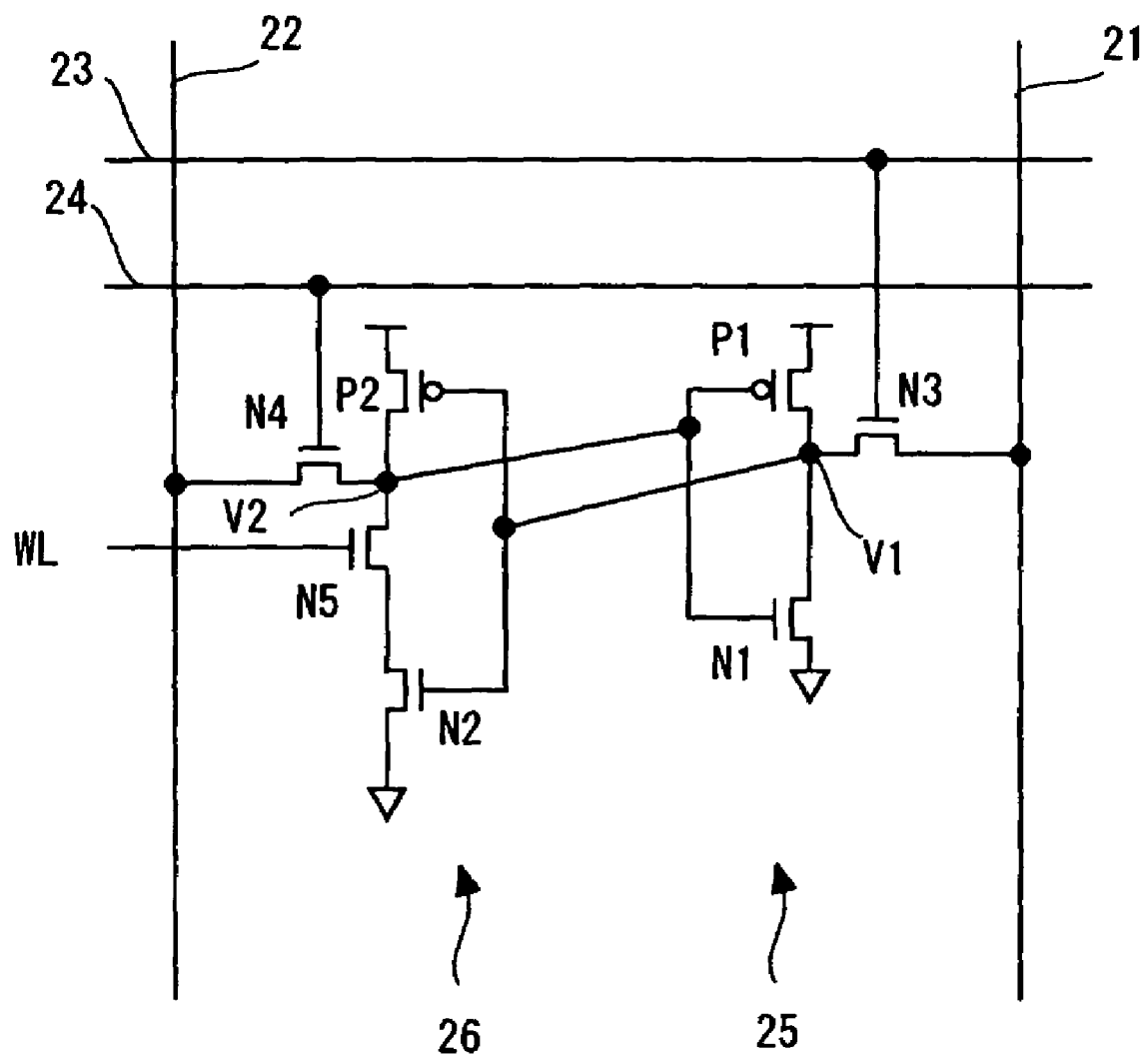
FIG. 3 is a circuit diagram illustrating the circuit configuration of a SRAM cell in Embodiment 1.

FIG. 3 is a circuit diagram illustrating the configuration of the SRAM cell that can control the cell data destruction. A SRAM cell 2 has a single end configuration in which a digit line 21 for reading and a digit line 22 for writing are connected. Furthermore, in the SRAM cell 2, a word line 23 for reading and a word line 24 for writing are connected. During writing, the word line 24 for writing is selected and a write signal transmitted via the digit line 22 for writing is written into the SRAM cell. During reading, the word line 23 for reading is selected and a data signal stored in the SRAM cell is transmitted via the digit line 21 for reading.

The SRAM cell 2 comprises a read circuit 25 and a write circuit 26. The read circuit 25 comprises a CMOS inverter comprising a PMOS transistor P1 and a NMOS transistor N1 that have mutually connected gates. The read circuit 25 further comprises a NMOS transistor N3 that is a transfer gate. The gate of the NMOS transistor N3 is connected to the word line 23 for reading. One of the source and drain of the NMOS transistor N3 is connected to the digit line 21 for reading, and the other is connected to a node V1 (CMOS inverter output) between the drains of the PMOS transistor P1 and NMOS transistor N1.

The write circuit 26 comprises a PMOS transistor P2 and a NMOS transistor N2 that have mutually connected gates. The gates thereof are connected to the node V1 of the read circuit 25, that is, to the CMOS inverter output. A source/drain of a NMOS transistor N5 is connected between the drains of the PMOS transistor P2 and NMOS transistor N2. The NMOS transistor N5 is an example of a control transistor. The word line signal WL is inputted into the gate of the NMOS transistor N5.

In the ON state of the NMOS transistor N5, the PMOS transistor P2 and NMOS transistor N2 form the usual CMOS inverter configuration. The write circuit 26 further comprises a NMOS transistor N4 that is a transfer gate. The gate of the NMOS transistor N4 is connected to the word line 24 for writing. A node V2 is connected to the digit line 22 for writing via the NMOS transistor N4. More specifically, one of the source/drains of the NMOS transistor N4 is connected to the node V2 located between the PMOS transistor P2 and NMOS transistor N5, and the other is connected to the digit line 22 for writing. Furthermore, the node V2 is connected to the gate input of the CMOS inverter of the read circuit 25.

The operation of reading from the SRAM cell 2 will be explained below. When the SRAM cell 2 is not accessed, the word line signal WL is HIGH and the NMOS transistor N5 is in the ON state. In this state, the SRAM cell has a flip-flop configuration comprising two CMOS inverters and the stability of the SRAM cell 2 is realized. When the SRAM cell 2 is accessed, the word line 23 for reading is HIGH and the NMOS transistor N3 is in the ON state. Therefore, the potential of the node V1 is outputted into the digit line 21 for reading. Furthermore, the word line signal WL is LOW and NMOS transistor N5 turns to the OFF state. Because the NMOS transistor N5 turns to the OFF state, the potential of the node V2 can be prevented from decreasing and the bit inversion of the read signal can be also prevented.

Embodiment 2

Figure 4:
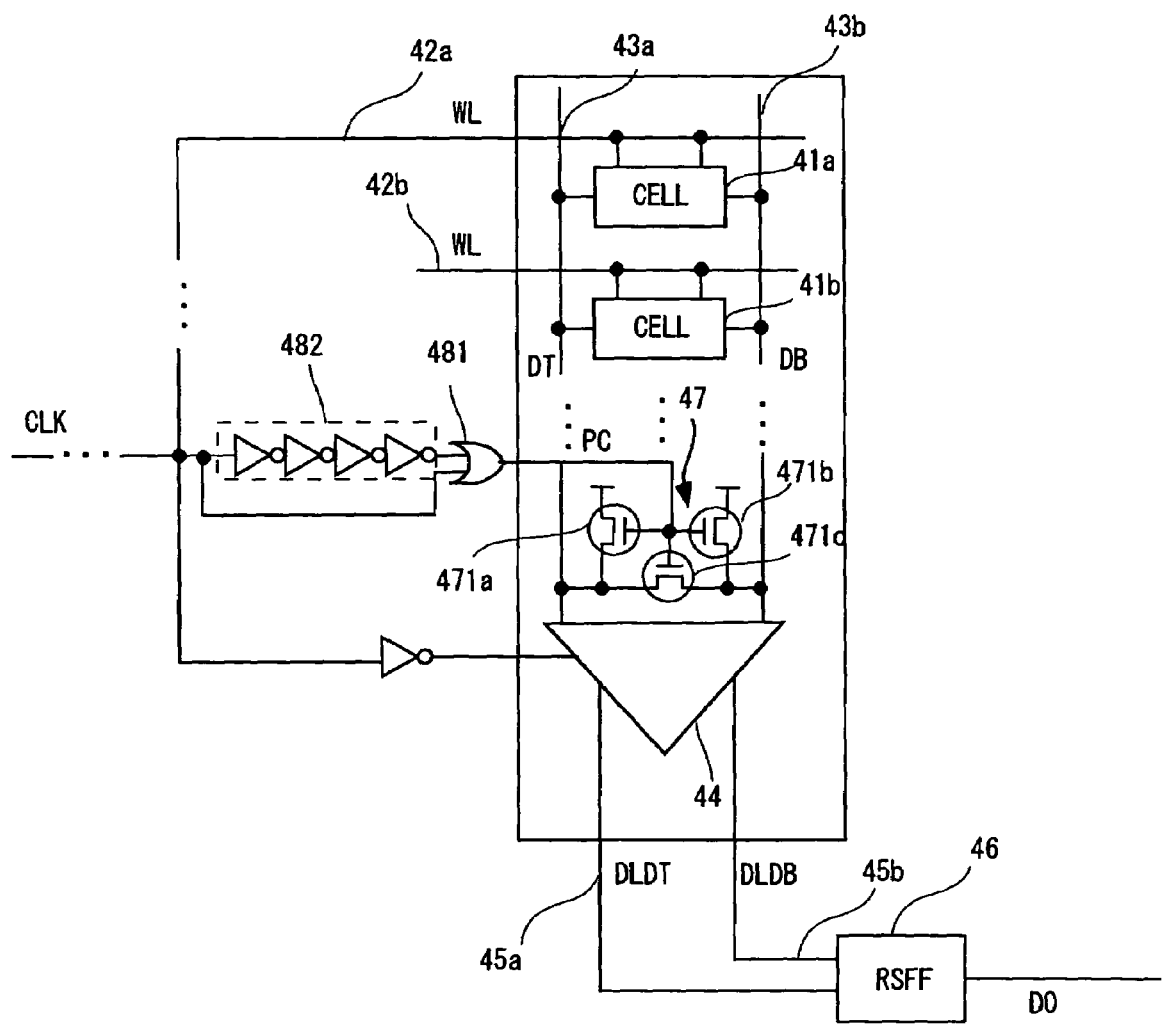
FIG. 4 illustrates schematically the configuration of an external clock synchronization SRAM of a dual end configuration in Embodiment 2.

As described above the circuit configuration of the present invention is especially suitable for a SRAM of a single end configuration, but it can be also applied to a SRAM of a dual end configuration. FIG. 4 shows an external clock signal SRAM of another embodiment of the present invention which has a dual end configuration. The technology relating to holding the SRAM cell output signal of the present embodiment is useful in the case where the time taken by the SRAM cell to pull out the charge of the digit line is longer than the period of the external clock. For this reason, a SRAM of a dual end configuration having such a characteristic will be explained below.

Referring to FIG. 4, an external clock signal SRAM 4 comprises a plurality of SRAM cells. In FIG. 4, two SRAM cells 41a, 41b are shown by way of an example. Word lines 42a, 42b for cell selection are connected to the SRAM cells 41a, 41b. Two digit lines 43a, 43b are connected to the SRAM cells 41a, 41b, respectively, and the output from the SRAM cells is transmitted as a differential signal. Further, a signal of the word lines 42a, 42b is represented by WL, and the signals on the digit lines 43a, 43b are represented by DT, and DB, respectively.

A sense amplifier 44 is connected to the output sides of the digit lines 43*a*, 43*b*. The sense amplifier 44 is controlled by an enable signal SES. In the active state, the sense amplifier 44 amplifies and outputs the difference between the digit line signals DT, DB. A RC flip-flop 46 serving as a data holding circuit is connected to the output of the sense amplifier 44 via the sense amplifier output lines 45*a*, 45*b*. The signals on the sense amplifier output lines 45*a*, 45*b* are represented by DLDT and DLDB. The digit lines 43*a*, 43*b* and sense amplifier output lines 45*a*, 45*b* are the transmission lines for transmitting signals from the SRAM cells.

A precharge circuit 47 for precharging the digit lines 43*a*, 43*b* is connected to the digit lines 43*a*, 43*b*. Furthermore, the precharge control circuit 48 controls the precharge processing of the precharge circuit 47. The precharge circuit 47 sets the digit lines 43*a*, 43*b* to an initial voltage prior to reading from the SRAM cells and writing thereto. Similarly to the above-described example, the precharge circuit 47 supplies HIGH (Vdd) as an initial voltage into the digit lines 43*a*, 43*b*.

The precharge circuit 47 of the present example comprises three PMOS transistors 471*a*-471*c*. Control signals from the precharge control circuit 48 are inputted into the gates of the PMOS transistors 471*a*-471*c*. The two PMOS transistors 471*a*, 471*b* have their sources connected to a power source and have their drains connected to the digit lines 43*a*, 43*b*. One PMOS transistor 471*c* is for balance; the source and drain thereof are connected to the digit lines 43*a*, 43*b*, respectively. If the control signal becomes LOW, the PMOS transistors 471*a*-471*c* are switched ON and the digit lines 43*a*, 43*b* are precharged to HIGH.

The precharge control circuit 48 comprises an OR logical circuit 418 and a delay circuit 482. The output of the delay circuit 482 is connected to one input of the OR logical circuit 481. The output of the OR logical circuit 481 is connected to the precharge circuit 47. A signal synchronized with the external clock signal is inputted into the OR logical circuit 481, but because of the delay circuit 482, a shift equal to the delay caused by the delay circuit 482 is generated in the timing of the two inputs.

Figure 5:
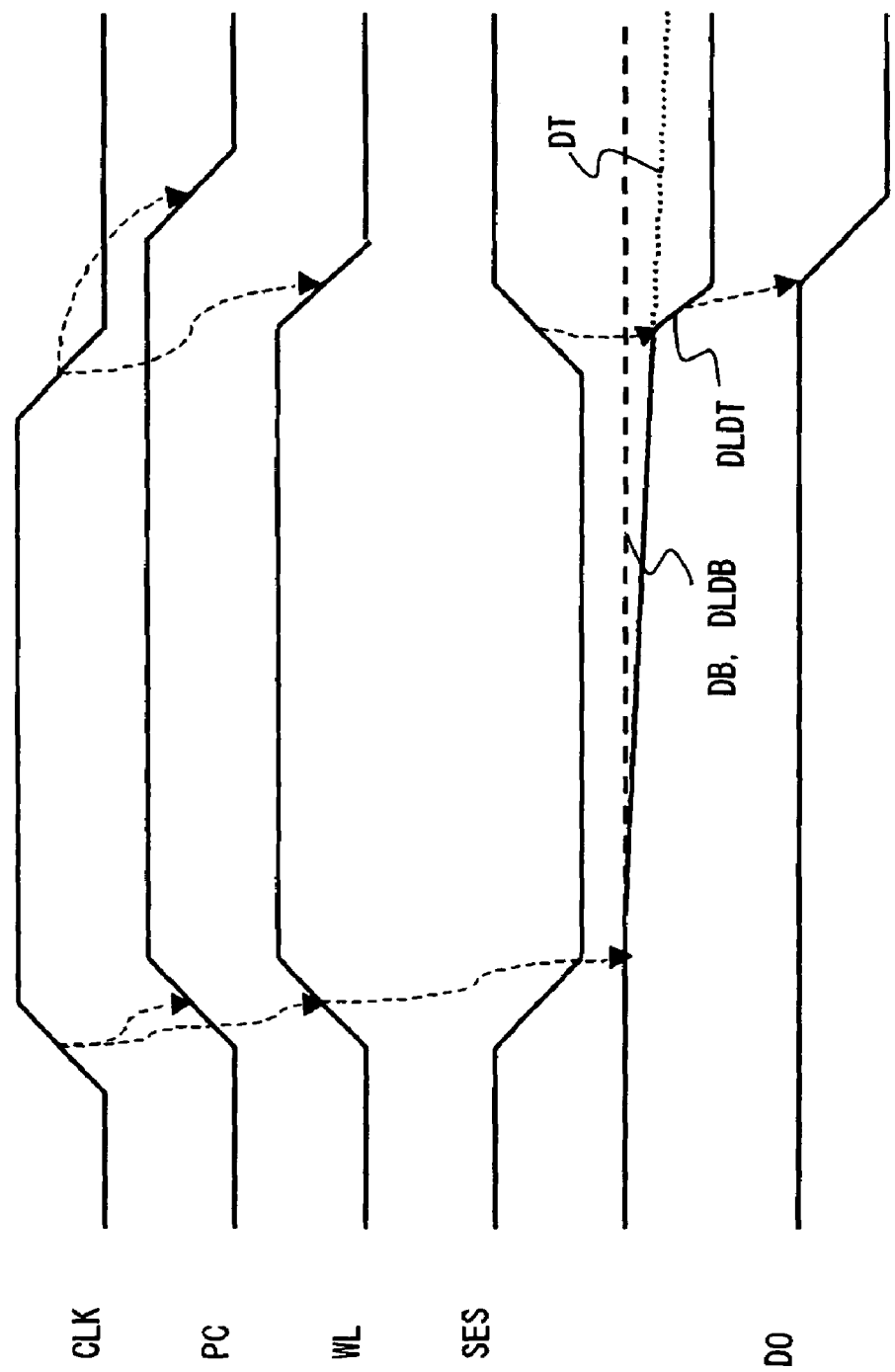
FIG. 5 is a timing chart illustrating the operation of the external clock synchronization SRAM shown in FIG. 4 of Embodiment 2.
Figure 6:
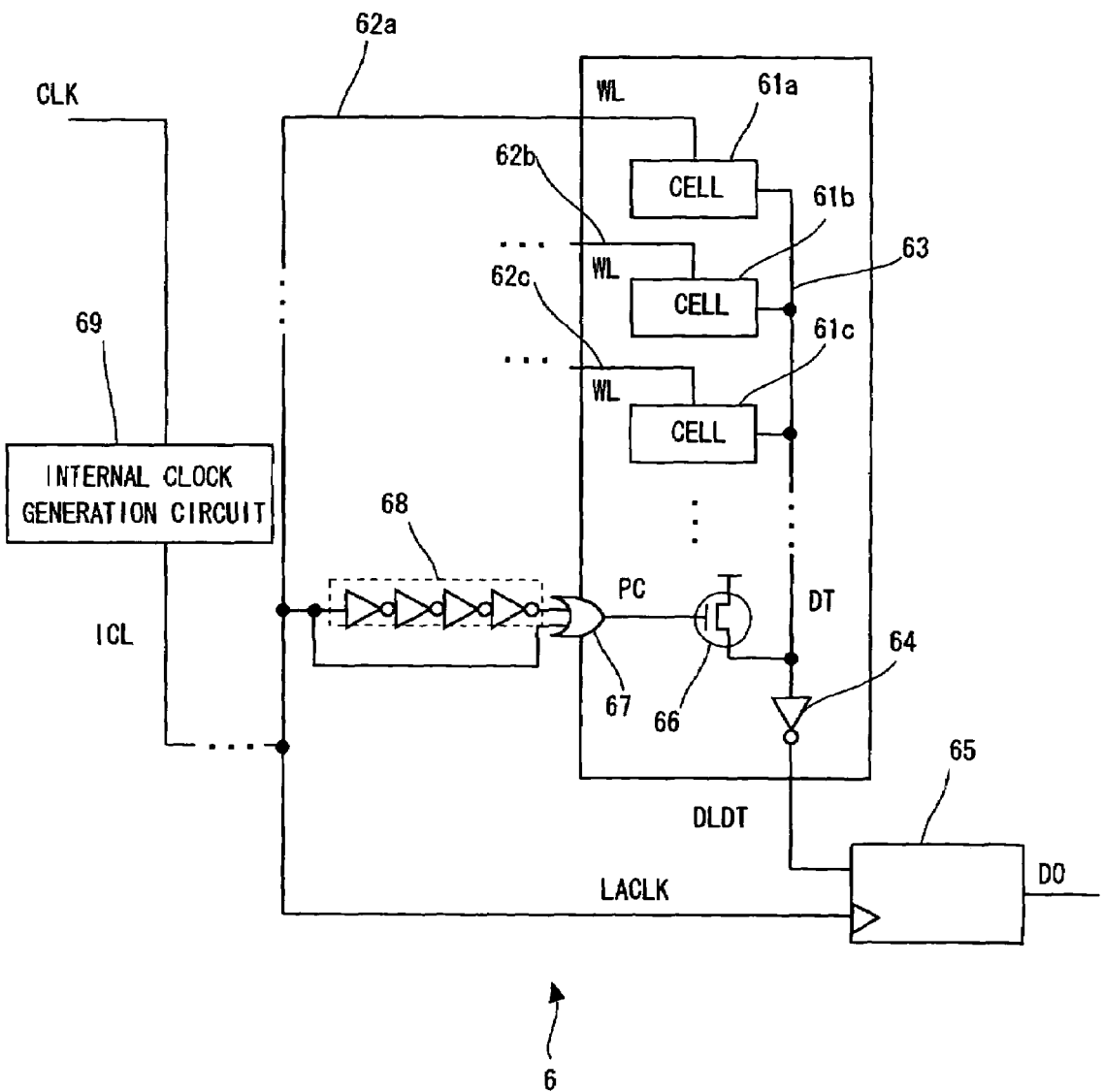
FIG. 6 illustrates schematically an internal clock synchronization SRAM representing the background of the present invention.
Figure 7:
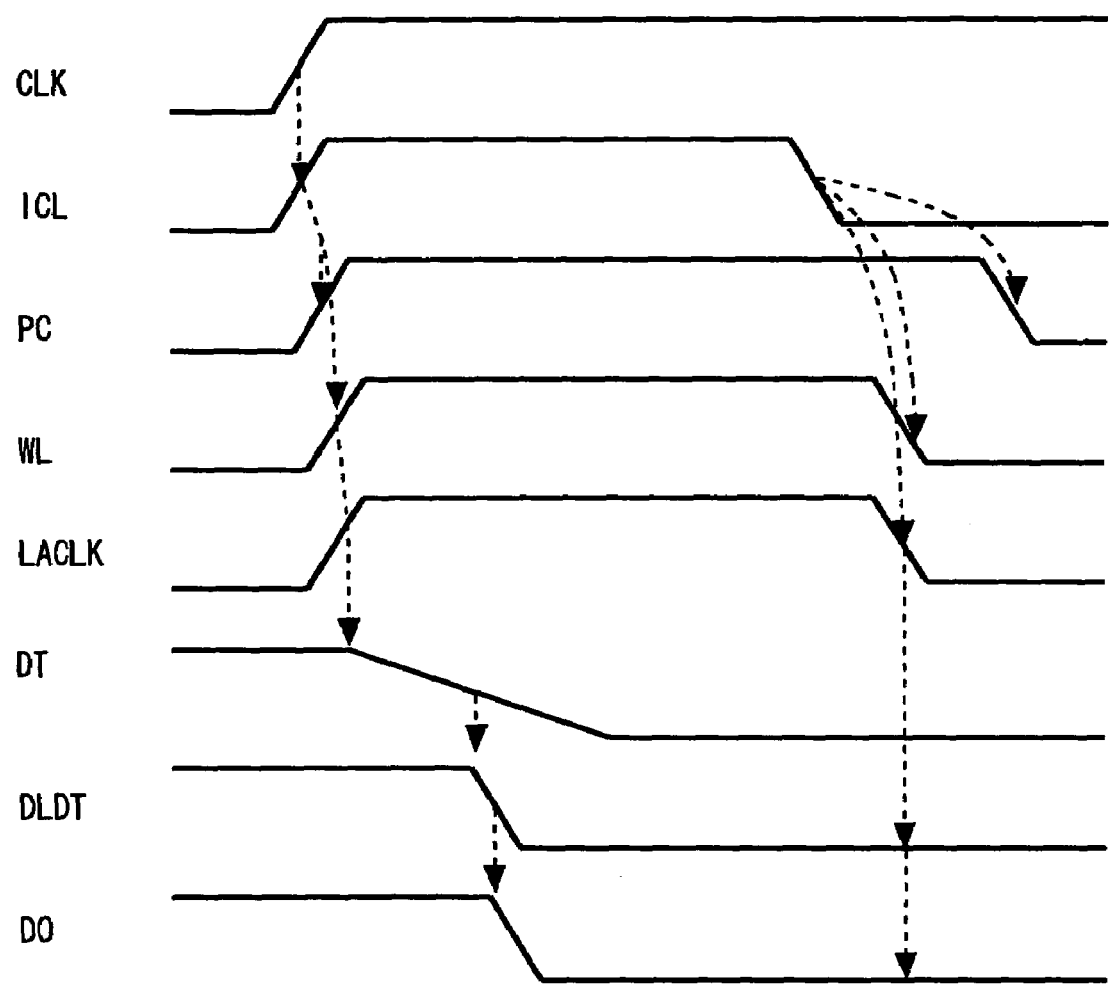
FIG. 7 is a timing chart illustrating the operation of the internal clock synchronization SRAM shown in FIG. 6 of the background of the present invention.
Figure 8:
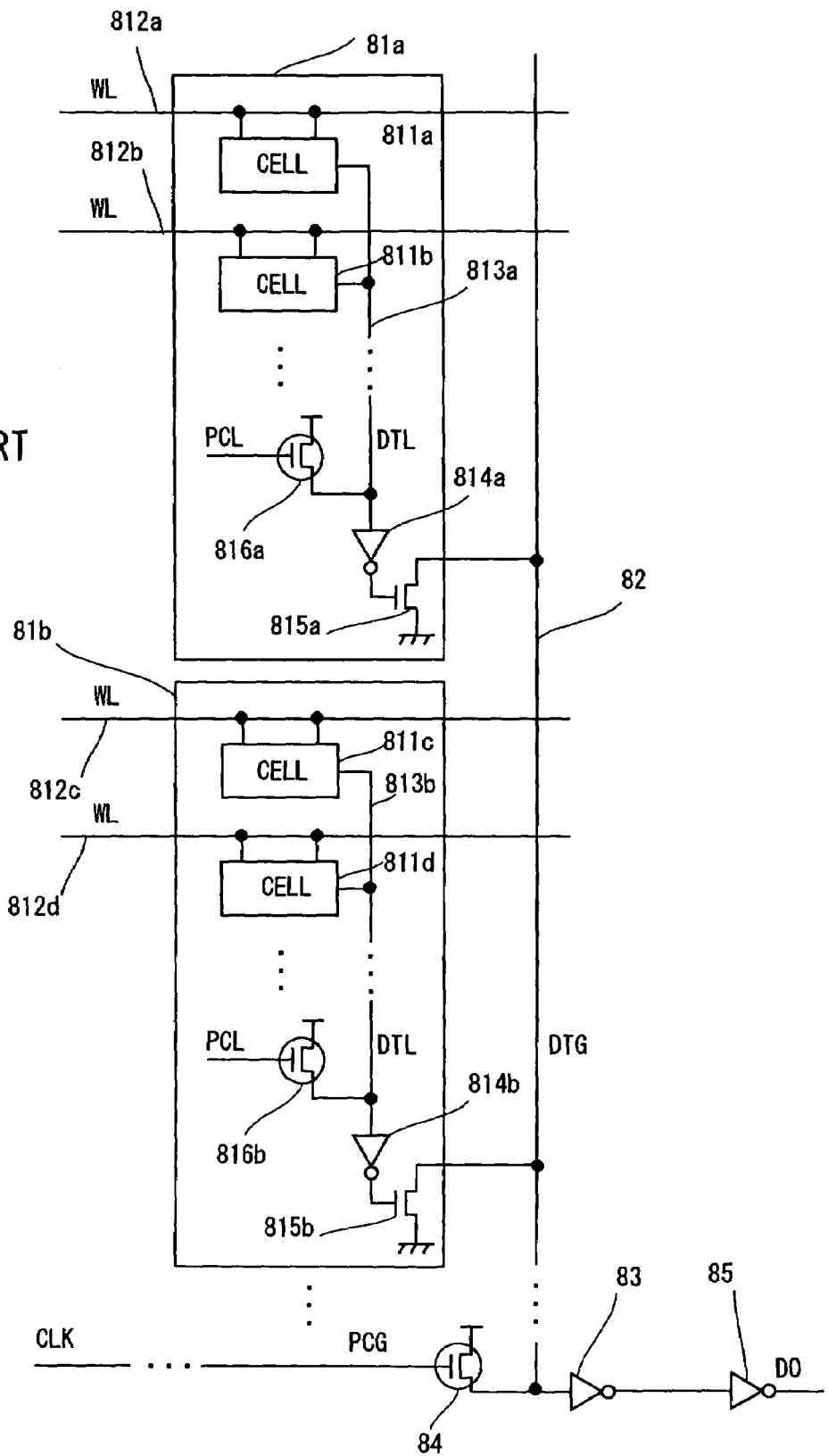
FIG. 8 illustrates schematically an external clock synchronization SRAM representing the background of the present invention.
Figure 9:
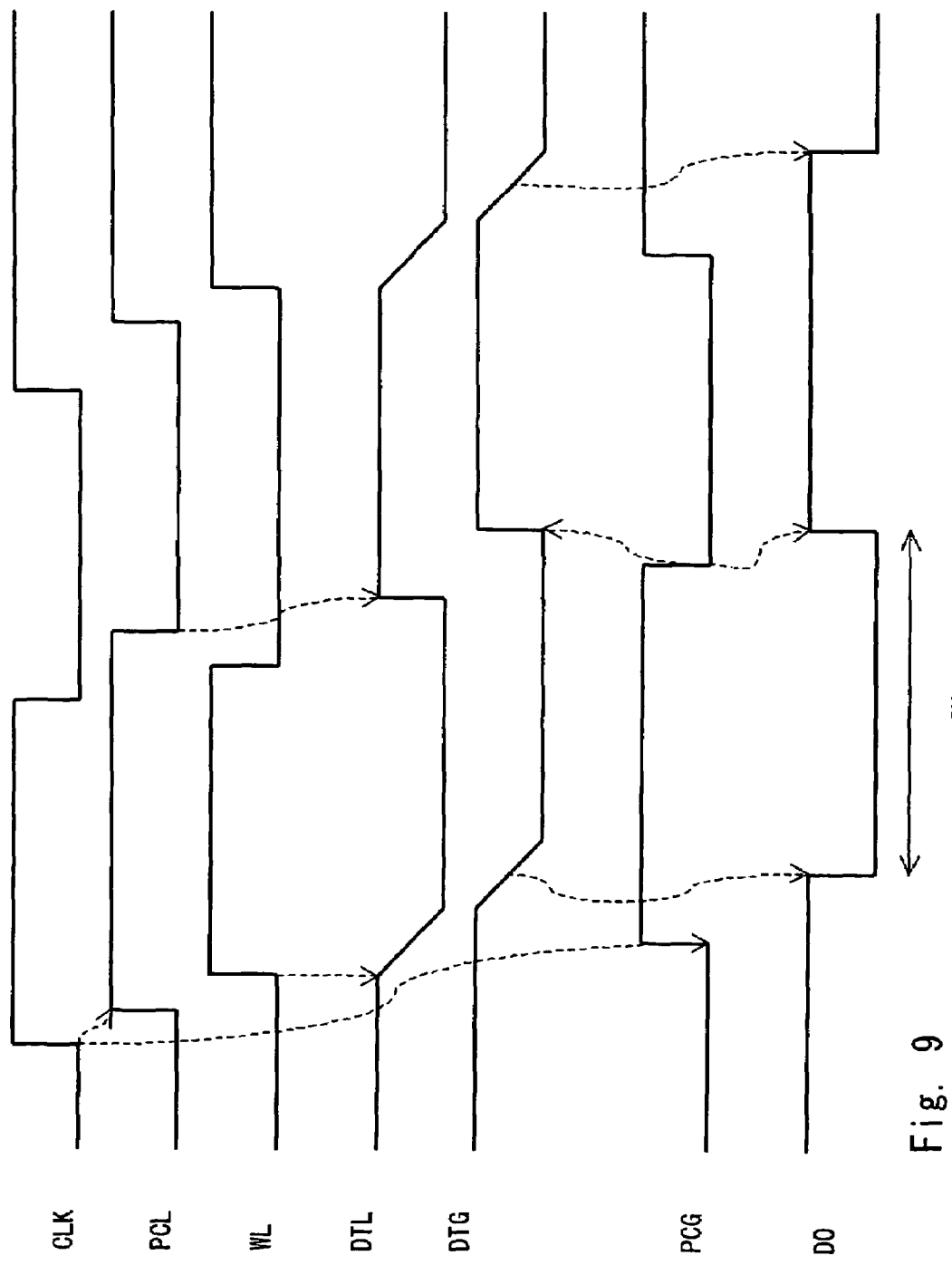
FIG. 9 is a timing chart illustrating the operation of the external clock synchronization SRAM shown in FIG. 8 of the background of the present invention.

The operation of the external clock signal SRAM 4 of the present embodiment will be described below in greater detail with reference to FIG. 5. Here, the processing of reading a LOW signal ("0" data) from the selected SRAM cell will be explained. if the external clock signal CLK changes from LOW to HIGH, the precharge control signal PC changes from LOW to HIGH. A slight delay of the size of a parasitic capacitance exists between those signals. Furthermore, synchronously with the change of the external clock signal CLK, a specific word line potential WL changes from LOW to HIGH. The enable signal SES of the sense amplifier is a signal obtained by inverting the external clock signal with the inverter and changes from HIGH to LOW.

The precharge control signal PC changing from LOW to HIGH initially sets the digit line signals DT, DB to HIGH. Then, the selected SRAM cell gradually pulls out the electric charge of the digit line 43*a*. As the electric charge of the SRAM cell is being pulled out, the digit line potential DT gradually decreases. Here, because the sense amplifier 44 is in a disable state, the sense amplifier output signals DLDT, DLDB become equal to the digit line signals DT, DB, respectively. Furthermore, an output from the RS flip-flop 46 is HIGH.

The external clock signal CLK then changes from HIGH to LOW. In response thereto, the enable signal SES of the sense amplifier changes from HIGH to LOW. As a result, the sense amplifier 44 becomes active and the difference in potential appears between the DLDT and DLDB. The RS flip-flop 46 fetches this signal, and the output DO changes from HIGH to LOW.

Then, in response to the change of the external clock signal CLK, the WL changes from HIGH to LOW in the word line transmission. The precharge control signal PC changes from HIGH to LOW with a delay corresponding to the delay created by the delay circuit 482. The sense amplifier 44 becomes active before the precharge control signal PC changes from HIGH to LOW. Because the sense amplifier 44 performs the amplification operation after dividing the outputs 45*a*, 45*b* thereof and the potentials of the digit lines 43*a*, 43*b*, the output of the sense amplifier 44 and the data (output DO) held in the RS flip-flop 46 are also maintained at LOW. The explanation provided hereinabove makes it clear, that in the present embodiment the SES signal executes the action equivalent to that of the LACLK signal of Embodiment 1.

As described hereinabove, in the present embodiment the RS flip-flop 46 is provided as an output data holding circuit and the delay circuit 482 is provided for delaying the output change of the precharge circuit 47. Therefore, in the SRAM of a dual end configuration comprising a sense amplifier, the maintenance time of the cell output signal can be extended.

The present invention is not limited to the above-described embodiments. Various components of the above-described embodiments can be easily changes, modified, or converted by a person skilled in the art, without departing from the scope of the present invention. For example, the present invention is not limited to a SRAM and can be also employed in an external clock synchronization semiconductor memory device having other cell configuration.

What is claimed is:

1. An external clock synchronization semiconductor memory device in which each internal circuit operates according to a clock signal input from outside, comprising:
   a memory cell;
   a memory cell signal transmission line transmitting an output signal from the memory cell;
   a precharge circuit precharging the memory cell signal transmission line;
   a signal holding circuit fetching a signal transmitted by the memory cell signal transmission line according to a fetch control signal and outputting the fetched signal; and
   a precharge control circuit conducting control so that a precharge output of the precharge circuit changes with a delay with respect to the fetch control signal.

2. The external clock synchronization semiconductor memory device according to claim 1, wherein
   the external clock synchronization semiconductor memory device has a single end configuration in which the output signal from the memory cell is transmitted by a single memory cell signal transmission line.

3. The external clock synchronization semiconductor memory device according to claim 2, wherein
   the signal holding circuit is a latch inputted with a clock signal as the fetch control signal; and
   the precharge control circuit conducts control so that the precharge output of the precharge circuit changes with a delay with respect to the clock signal inputted to the latch.

4. The external clock synchronization semiconductor memory device according to claim 1, wherein
   the precharge control circuit comprises an OR logical circuit and a delay circuit connected to one input of the OR logical circuit.

5. The external clock synchronization semiconductor memory device according to claim 2, wherein
the precharge control circuit comprises an OR logical circuit and a delay circuit connected to one input of the OR logical circuit.

6. The external clock synchronization semiconductor memory device according to claim 3, wherein
the precharge control circuit comprises an OR logical circuit and a delay circuit connected to one input of the OR logical circuit.

7. The external clock synchronization semiconductor memory device according to claim 2, wherein
the memory cell is a SRAM cell comprising a read circuit connected to a read digit line and a write circuit connected to a write digit line;
the read circuit comprises a CMOS inverter outputting a memory data signal;
the write circuit comprises a PMOS transistor and a NMOS transistor having gates thereof connected to the CMOS inverter output, and a control transistor connected between the drains of the PMOS transistor and NMOS transistor, the control transistor being OFF in an access period and ON in a non-access period, and wherein
the write digit line and the gate of the CMOS inverter of the read circuit are connected in the write circuit between the control transistor and the PMOS transistor.

8. The external clock synchronization semiconductor memory device according to claim 3, wherein
the memory cell is a SRAM cell comprising a read circuit connected to a read digit line and a write circuit connected to a write digit line;
the read circuit comprises a CMOS inverter for outputting a memory data signal;
the write circuit comprises a PMOS transistor and a NMOS transistor having gates thereof connected to the CMOS inverter output, and a control transistor connected between the drains of the PMOS transistor and NMOS transistor, the control transistor being OFF in an access period and ON in a non-access period, and wherein
the write digit line and the gate of the CMOS inverter of the read circuit are connected in the write circuit between the control transistor and the PMOS transistor.

9. The external clock synchronization semiconductor memory device according to claim 1, wherein
the external clock synchronization semiconductor memory device comprises a plurality of banks and a global digit line having the output of each bank connected thereto;
the signal holding circuit fetches and holds a signal transmitted by the global digit line; and
the precharge circuit precharges the global digit line.

10. The external clock synchronization semiconductor memory device according to claim 2, wherein
the external clock synchronization semiconductor memory device comprises a plurality of banks and a global digit line having the output of each bank connected thereto;
the signal holding circuit fetches and holds a signal transmitted by the global digit line; and
the precharge circuit precharges the global digit line.

11. The external clock synchronization semiconductor memory device according to claim 3, wherein
the external clock synchronization semiconductor memory device comprises a plurality of banks and a global digit line having the output of each bank connected thereto;
the signal holding circuit fetches and holds a signal transmitted by the global digit line; and
the precharge circuit precharges the global digit line.

12. The external clock synchronization semiconductor memory device according to claim 4, wherein
the external clock synchronization semiconductor memory device comprises a plurality of banks and a global digit line having the output of each bank connected thereto;
the signal holding circuit fetches and holds a signal transmitted by the global digit line; and
the precharge circuit precharges the global digit line.

13. The external clock synchronization semiconductor memory device according to claim 5, wherein
the external clock synchronization semiconductor memory device comprises a plurality of banks and a global digit line having the output of each bank connected thereto;
the signal holding circuit fetches and holds a signal transmitted by the global digit line; and
the precharge circuit precharges the global digit line.

14. The external clock synchronization semiconductor memory device according to claim 6, wherein
the external clock synchronization semiconductor memory device comprises a plurality of banks and a global digit line having the output of each bank connected thereto;
the signal holding circuit fetches and holds a signal transmitted by the global digit line; and
the precharge circuit precharges the global digit line.

15. The external clock synchronization semiconductor memory device according to claim 7, wherein
the external clock synchronization semiconductor memory device comprises a plurality of banks and a global digit line having the output of each bank connected thereto;
the signal holding circuit fetches and holds a signal transmitted by the global digit line; and
the precharge circuit precharges the global digit line.

16. The external clock synchronization semiconductor memory device according to claim 8, wherein
the external clock synchronization semiconductor memory device comprises a plurality of banks and a global digit line having the output of each bank connected thereto;
the signal holding circuit fetches and holds a signal transmitted by the global digit line; and
the precharge circuit precharges the global digit line.

17. The external clock synchronization semiconductor memory device according to claim 1, wherein
the external clock synchronization semiconductor memory device has a dual end configuration in which an output signal from the memory cell is transmitted by two memory cell signal transmission lines,
the memory device further comprising a sense amplifier for amplifying the signal on the two memory cell signal transmission lines, and wherein the precharge circuit precharges the two memory cell signal transmission lines on the input side of the sense amplifier;

the signal holding circuit is connected to the output side of the sense amplifier; and the precharge control circuit conducts control so that a precharge output of the precharge circuit changes with a delay with respect to an enable signal of the sense amplifier serving as the fetch control signal.

18. A control method for an external clock synchronization semiconductor memory device in which each internal circuit operates according to a clock signal input from outside, the control method comprising:

selecting a memory cell for outputting a signal;

fetching the selected memory cell output transmitted on a transmission line to a signal holding circuit and outputting the fetched signal as an output signal to the outside; and precharging the transmission line after the fetching of a signal by the signal holding circuit is prohibited.

19. A control method for an external clock synchronization semiconductor memory device according to claim 18, wherein the signal holding circuit is a D latch and the transmission line is precharged with a delay with respect to the change of the input clock signal to the D latch.

* * * * *